US010312237B2

(12) United States Patent
Bao et al.

(10) Patent No.: US 10,312,237 B2
(45) **Date of Patent: *Jun. 4, 2019**

(54) VERTICAL TRANSPORT TRANSISTORS WITH EQUAL GATE STACK THICKNESSES

(71) Applicant: INTERNATIONAL BUSINESS MACHINES CORPORATION, Armonk, NY (US)

(72) Inventors: Ruqiang Bao, Wappingers Falls, NY (US); Zhenxing Bi, Niskayuna, NY (US); Choonghyun Lee, Rensselaer, NY (US); Zheng Xu, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/058,173

(22) Filed: Aug. 8, 2018

(65) Prior Publication Data

US 2018/0350811 A1 Dec. 6, 2018

Related U.S. Application Data

(63) Continuation of application No. 15/582,905, filed on May 1, 2017.

(51) Int. Cl.
*H01L 27/06* (2006.01)
*H01L 27/24* (2006.01)
(Continued)

(52) U.S. Cl.
CPC ...... *H01L 27/092* (2013.01); *H01L 21/82285* (2013.01); *H01L 21/823487* (2013.01); (Continued)

(58) Field of Classification Search
None
See application file for complete search history.

(56) References Cited

U.S. PATENT DOCUMENTS 7,405,127 B2 7/2008 Tews
7,736,965 B2 6/2010 Cheng et al.
(Continued)

FOREIGN PATENT DOCUMENTS

CN 102640273 8/2012
CN 102956702 3/2013
(Continued)

OTHER PUBLICATIONS

International Search Report for International Application No. PCT/IB2018/052586 dated Jul. 18, 2018 (9 pages).
(Continued)

*Primary Examiner* — Telly D Green
(74) *Attorney, Agent, or Firm* — Tutunjian & Bitetto, P.C.; Vazken Alexanian

(57) ABSTRACT

Integrated chips include a first semiconductor device and a second semiconductor device. The first semiconductor device includes a semiconductor channel, a first-type work function layer formed from a first material on the semiconductor channel, and a second-type work function layer formed from a second material on the first-type work function later layer. The second semiconductor device includes a semiconductor channel, a second-type work function layer formed the second material on the semiconductor channel, and a thickness matching layer formed on the second-type work function layer of the second semiconductor device, the thickness matching layer having a thickness roughly equal to a thickness of the first-type work function layer.

17 Claims, 9 Drawing Sheets

1404
1402
302
110
304
202
116
118

(51) Int. Cl.

| | |
|---|---|
| ***H01L 29/49*** | (2006.01) |
| ***H01L 29/66*** | (2006.01) |
| ***H01L 29/78*** | (2006.01) |
| ***H01L 27/092*** | (2006.01) |
| ***H01L 29/786*** | (2006.01) |
| ***H01L 21/8228*** | (2006.01) |
| ***H01L 21/8234*** | (2006.01) |
| ***H01L 21/8238*** | (2006.01) |

(52) U.S. Cl.

CPC .. *H01L 21/823885* (2013.01); *H01L 27/0652* (2013.01); *H01L 27/0658* (2013.01); *H01L 27/0664* (2013.01); *H01L 27/2454* (2013.01); *H01L 29/4966* (2013.01); *H01L 29/6653* (2013.01); *H01L 29/66666* (2013.01); *H01L 29/66712* (2013.01); *H01L 29/66719* (2013.01); *H01L 29/66734* (2013.01); *H01L 29/7802* (2013.01); *H01L 29/7803* (2013.01); *H01L 29/7827* (2013.01); *H01L 29/78642* (2013.01)

(56) References Cited

U.S. PATENT DOCUMENTS

| | | | |
|---|---|---|---|
| 9,318,447 | B2 | 4/2016 | Peng et al. |
| 9,330,937 | B2 | 5/2016 | Nowling et al. |
| 9,343,372 | B1 | 5/2016 | Bao et al. |
| 9,553,092 | B2 | 1/2017 | Bao et al. |
| 2015/0371872 | A1 | 12/2015 | Foster et al. |
| 2015/0380539 | A1 | 12/2015 | Colinge et al. |
| 2015/0380548 | A1 | 12/2015 | Wang et al. |
| 2016/0064541 | A1 | 3/2016 | Diaz et al. |

FOREIGN PATENT DOCUMENTS

| | | |
|---|---|---|
| CN | 105405886 | 3/2016 |
| CN | 106505104 | 3/2017 |
| CN | 106601605 | 4/2017 |

OTHER PUBLICATIONS

List of IBM Patents or Patent Applications Treated as Related dated Aug. 8, 2018, 2 pages.

VERTICAL TRANSPORT TRANSISTORS WITH EQUAL GATE STACK THICKNESSES

BACKGROUND

Technical Field

The present invention generally relates to transistor fabrication and, more particularly, to the fabrication of vertical transport transistors having consistent gate thicknesses between device types.

Description of the Related Art

Field effect transistors (FETs) have been employed to scale device size down as fabrication technologies have improved. Vertical transport FETs provide an opportunity for further device scaling. However, forming devices with equal gate thickness is particularly important in high-k/metal gate fabrication processes for vertical transport FETs to reduce gate variation during gate recess. This defines the gate length, and having consistent gate lengths helps to reduce the challenge of gate encapsulation and gate isolation.

SUMMARY

An integrated chip includes a first semiconductor device and a second semiconductor device. The first semiconductor device includes a semiconductor channel, a first-type work function layer formed from a first material on the semiconductor channel, and a second-type work function layer formed from a second material on the first-type work function later layer. The second semiconductor device includes a semiconductor channel, a second-type work function layer formed the second material on the semiconductor channel, and a thickness matching layer formed on the second-type work function layer of the second semiconductor device, the thickness matching layer having a thickness roughly equal to a thickness of the first-type work function layer.

An integrated chip includes a first semiconductor device and a second semiconductor device. The first semiconductor device includes a semiconductor channel, a first-type work function layer formed on the semiconductor channel, and second-type work function layer formed on the first-type work function layer. The second semiconductor device includes a semiconductor channel, a second-type work function layer formed on the semiconductor channel, and a thickness matching layer formed on the second-type work function layer, the thickness matching layer having a thickness roughly equal to a thickness of the first-type work function layer. An inter-device connection connects the first semiconductor device and the second semiconductor device and includes portions of the first-type work function layer, the second-type work function layer, and the thickness matching layer.

An integrated chip includes a first semiconductor device and a second semiconductor device. The first semiconductor device includes a semiconductor channel, a first-type work function layer formed on the semiconductor channel, a second-type work function layer formed on the first-type work function layer, and a scavenging layer on the second-type work function layer. A second semiconductor device includes a semiconductor channel, a second-type work function layer formed on the semiconductor channel, a scavenging layer on the second-type work function layer, and a thickness matching layer formed on the scavenging layer. The thickness matching layer has a thickness roughly equal to a thickness of the first-type work function layer.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide vertical transport field effect transistor (VTFET) structures that have equal gate thicknesses by using the selective etching of one gate metal relative to the metals in other gate stacks between n-type FETs and p-type FETs. Each device type can use a distinct gate stack with distinct metals, making it possible to etch a thicker gate stack to match the thickness of the gate stacks used by other device types.

Figure 1:
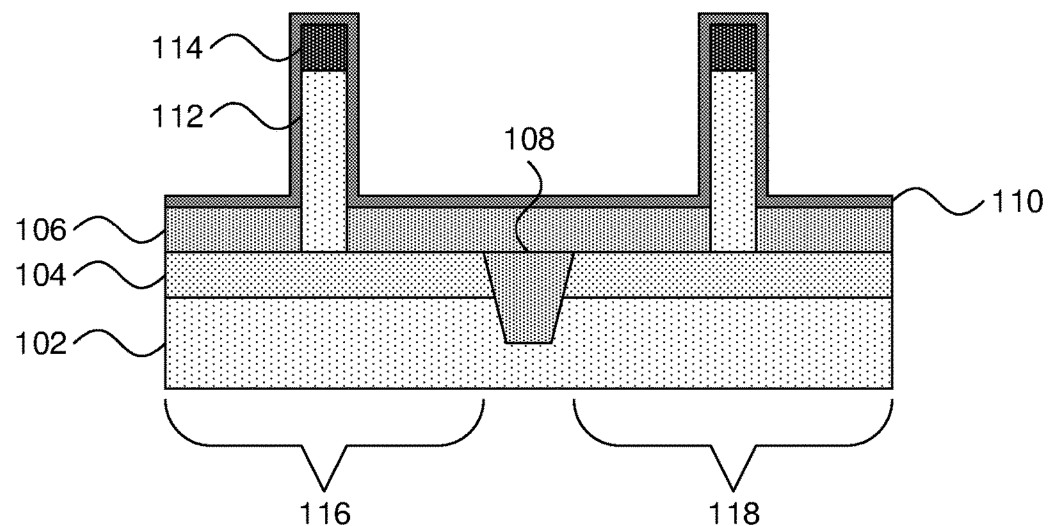
FIG. 1 is a cross-sectional diagram of a step in the formation of vertical field effect transistors (FETs) of different types having equal gate thicknesses in accordance with an embodiment of the present invention.

Referring now to the drawings in which like numerals represent the same or similar elements and initially to FIG. 1, a cross-sectional view of a step in the formation of vertical transistors having equal gate thicknesses is shown. A substrate 102 is divided into a first region 116 and a second region 118 using, for example, a shallow trench isolation process that cuts into the substrate 102 and deposits a dielectric barrier 108 in the trench. In some embodiments the substrate 102 may be a semiconductor substrate. The dielectric barrier 108 may be formed from, e.g., silicon dioxide or any other appropriate material.

A semiconductor substrate 102 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, a semiconductor substrate 102 may also be a semiconductor on insulator (SOI) substrate.

A bottom source/drain layer 104 is formed on the substrate 104. The bottom source/drain layer 104 is formed from, e.g., a doped semiconductor material. The semiconductor material may be a same material as used in the substrate 102 or may be a different semiconductor material. The dopant used in the bottom source/drain layer 104 will depend on the type of device being formed. For example, an n-type device may be formed in the first region 116 and will use an n-type dopant. A p-type device may be formed in the second region 118 and will use a p-type dopant. Each of the regions 116 and 118 will have a different dopant material. The dopant material may be added by, e.g., implantation.

As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium. As used herein, "n-type" refers to the addition of impurities that contributes free electrons to an intrinsic semiconductor. In a silicon containing substrate, examples of n-type dopants, i.e., impurities, include but are not limited to antimony, arsenic and phosphorous.

Channel fins 112 are formed on the bottom source/drain region 104. It is specifically contemplated that the channel fins 112 may be formed from silicon, but any other appropriate semiconductor material may be used instead. The channel fins may be formed by depositing a layer of semiconductor material on the bottom source/drain layer 104 depositing fin masks 114 on the layer, and anisotropically etching the layer around the fin masks 114. Reactive Ion Etching (RIE) is a form of plasma etching in which, during etching, the surface to be etched is placed on a radio-frequency powered electrode. During RIE, the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation. Alternatively, the channel fins 112 can be formed by spacer imaging transfer.

An isolation layer 106 is deposited over the bottom source/drain layer 104 to provide electrical isolation between the channel fins 112. Any appropriate dielectric material may be used for the isolation layer 106, such as silicon dioxide. A layer of gate dielectric material 110 is then conformally deposited over the channel fins 112 and the isolation layer 106. The layer of gate dielectric material maybe any appropriate dielectric including, e.g., high-k dielectrics.

As used herein, the term "high-k" refers to a material having a dielectric constant k that is higher than that of silicon dioxide. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k dielectric material may further include dopants such as lanthanum and aluminum.

The layer of gate dielectric material 110 may be deposited by any appropriate conformal process including, e.g., chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface.

Figure 2:
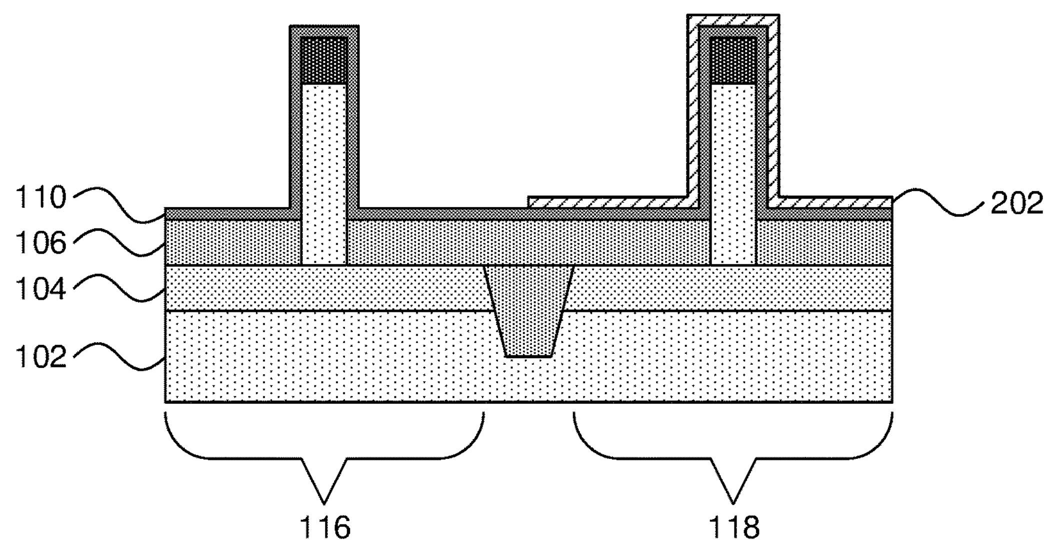
FIG. 2 is a cross-sectional diagram of a step in the formation of vertical FETs of different types having equal gate thicknesses in accordance with an embodiment of the present invention.

Referring now to FIG. 2, a cross-sectional view of a step in the formation of vertical transistors having equal gate thicknesses is shown. A p-type gate metal layer 202 is deposited in the second region 118. This material may be deposited using a conformal process, such as CVD, ALD, or PVD, and may be formed from an appropriate p-type work function material such as, e.g., titanium nitride. Other types of p-type work function materials include, e.g., titanium aluminum nitride, ruthenium, platinum, molybdenum, cobalt, and alloys thereof. The p-type gate metal layer may be deposited in both regions 116 and 118 and subsequently etched away from the first region 116 by masking the second region 118.

A work function material is a layer that provides a shift in the threshold voltage of a transistor device. In particular, a p-type work function material may be a material that moves the voltage threshold toward the valence band of silicon. In one embodiment, the work function of the p-type work function metal layer ranges from 4.9 eV to 5.2 eV. As used herein, "threshold voltage" is the lowest attainable gate voltage that will turn on a semiconductor device, e.g., a transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero.

The present embodiments make use of different work function metals in different regions, with some layers being shared between the devices in the different regions. In this manner the voltage threshold of each device can be controlled by the use of an appropriate metal without compromising gate thickness uniformity.

Figure 3:
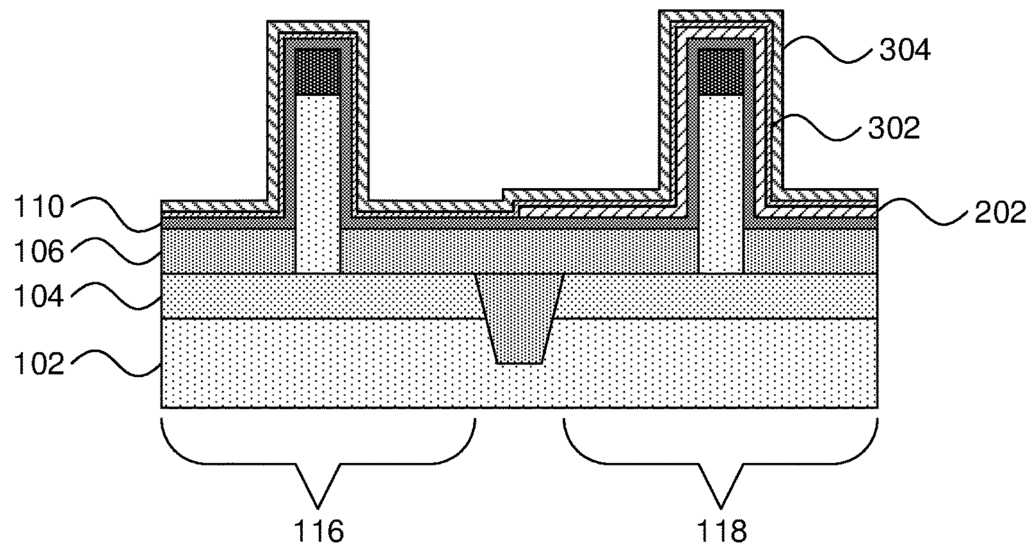
FIG. 3 is a cross-sectional diagram of a step in the formation of vertical FETs of different types having equal gate thicknesses in accordance with an embodiment of the present invention.

Referring now to FIG. 3, a cross-sectional view of a step in the formation of vertical transistors having equal gate thicknesses is shown. An n-type work function stack is formed from, e.g., a titanium nitride layer 302 and a titanium aluminum carbide layer 304. The stack is deposited conformally using any appropriate process such as, e.g., CVD, ALD, or PVD. An n-type work function material may be a material that moves the voltage threshold toward the conduction band of silicon in an n-type semiconductor device.

The "conduction band" is the lowest lying electron energy band of the doped material that is not completely filled with electrons. In one embodiment, the work function of the n-type work function metal layer ranges from 4.1 eV to 4.3 eV. In alternative embodiments, the n-type work function stack may include layers of titanium aluminum, tantalum nitride, hafnium nitride, hafnium silicon, or combinations thereof. The layers of the n-type work function stack may be formed by any appropriate deposition process including, e.g., CVD, ALD, or PVD.

Figure 4:
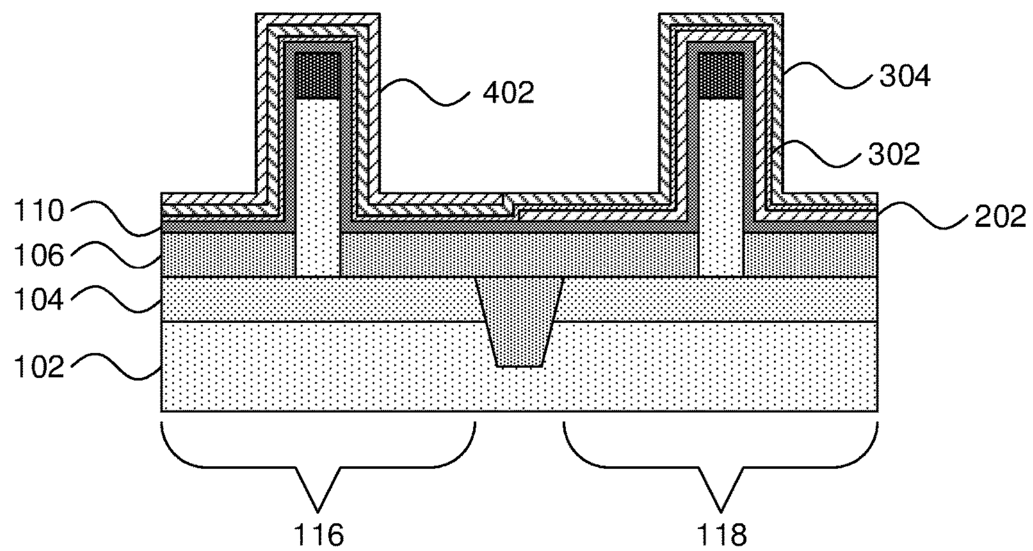
FIG. 4 is a cross-sectional diagram of a step in the formation of vertical FETs of different types having equal gate thicknesses in accordance with an embodiment of the present invention.

Referring now to FIG. 4, a cross-sectional view of a step in the formation of vertical transistors having equal gate thicknesses is shown. A matching layer 402 is formed in the first region 116 from, e.g., titanium nitride. The matching layer 402 may be formed by, e.g., conformally depositing the material over both regions 116 and 118, masking the first region 116, and then etching the material away from the second region 118. The thickness of the matching layer 402 is formed to make the thickness of the stack of materials on the channel fin 112 of the first region 116 equal to the thickness of the stack of materials on the channel fin 112 of the second region. Notably, the thickness of the matching layer will be roughly equal to the thickness of p-type gate metal layer 202.

In one exemplary embodiment, the p-type gate metal layer 202 may have an exemplary thickness between about 3 nm and about 5 nm, the titanium nitride layer may have an exemplary thickness between about 0.5 nm and about 1.5 nm, the titanium aluminum carbide layer 304 may have an exemplary thickness between about 3 nm and about 5 nm, and the matching layer may have an exemplary thickness between about 3 nm and about 5 nm. The total thickness in the first region 116 will be the sum of the layers 302, 304, and 402, having an exemplary range in this embodiment of between about 6.5 nm and about 11.5 nm. The total thickness in the second region 118 will be the sum of the layers 202, 302, and 304, having a same thickness as the stack of layers in the first region 116.

Figure 5:
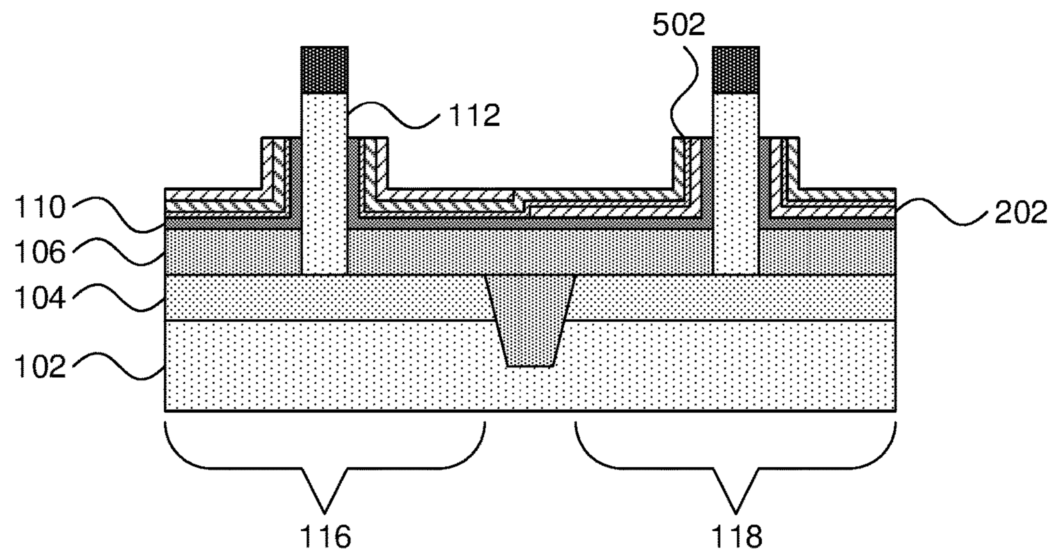
FIG. 5 is a cross-sectional diagram of a step in the formation of vertical FETs of different types having equal gate thicknesses in accordance with an embodiment of the present invention.

Referring now to FIG. 5, a cross-sectional view of a step in the formation of vertical transistors having equal gate thicknesses is shown. A layer of planarizing material is deposited over the first region 116 and the second region 118. The planarizing material may be, for example, an organic planarizing layer. The layers of gate metal and work function metals are etched back along with the planarizing material to form etched gate stacks 502. The planarizing material is then etched away to expose the gate stacks 502. The use of the planarizing material serves to protect the horizontal portions of the gate stacks around the fins 112.

Figure 6:
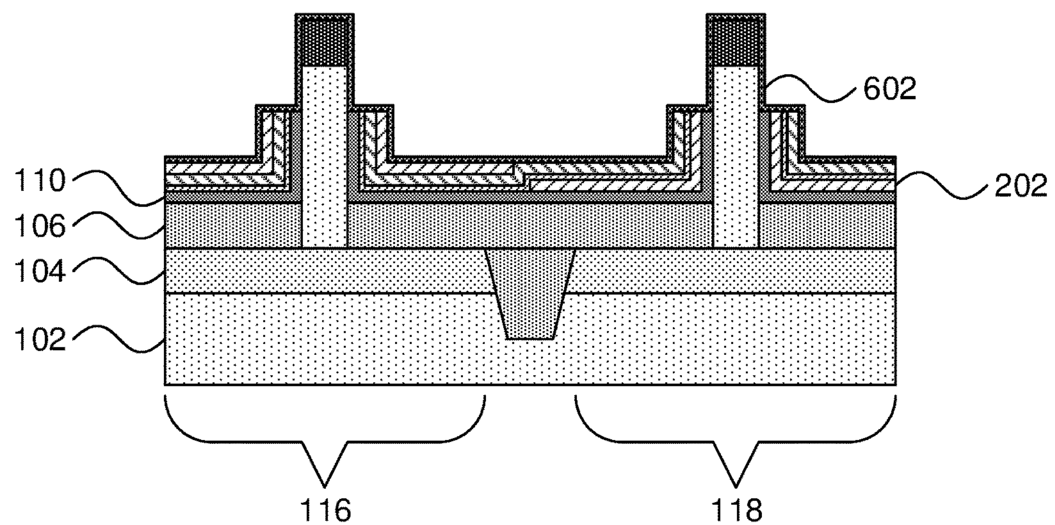
FIG. 6 is a cross-sectional diagram of a step in the formation of vertical FETs of different types having equal gate thicknesses in accordance with an embodiment of the present invention.

Referring now to FIG. 6, a cross-sectional view of a step in the formation of vertical transistors having equal gate thicknesses is shown. An encapsulation layer 602 is conformally deposited over the fins 112 and the recessed gate stacks 502. The encapsulation layer 602 can be formed by any appropriate deposition process such as, e.g., CVD, PVD, or ALD. The encapsulation layer 602 provides a barrier against oxygen used in downstream processes. The encapsulation layer 602 may be formed from, e.g., silicon nitride, silicon oxynitride, or silicon boron carbonitride.

Figure 7:
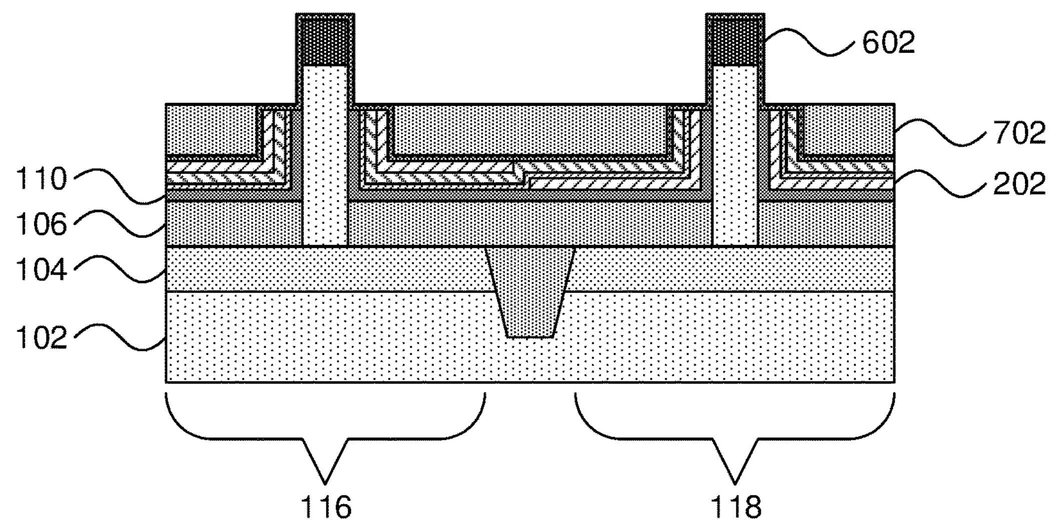
FIG. 7 is a cross-sectional diagram of a step in the formation of vertical FETs of different types having equal gate thicknesses in accordance with an embodiment of the present invention.

Referring now to FIG. 7, a cross-sectional view of a step in the formation of vertical transistors having equal gate thicknesses is shown. A gap dielectric 702 is deposited over the encapsulation layer 602 and is recessed back to a height of the gate stacks 502. It is specifically contemplated that silicon dioxide may be used for this purpose, but any appropriate dielectric material may be used instead. The gap dielectric 702 fills a space between the two fins 112 and may be deposited using any appropriate process including, e.g., CVD, PVD, ALD, or a spin-on process with a flowable dielectric material.

Figure 8:
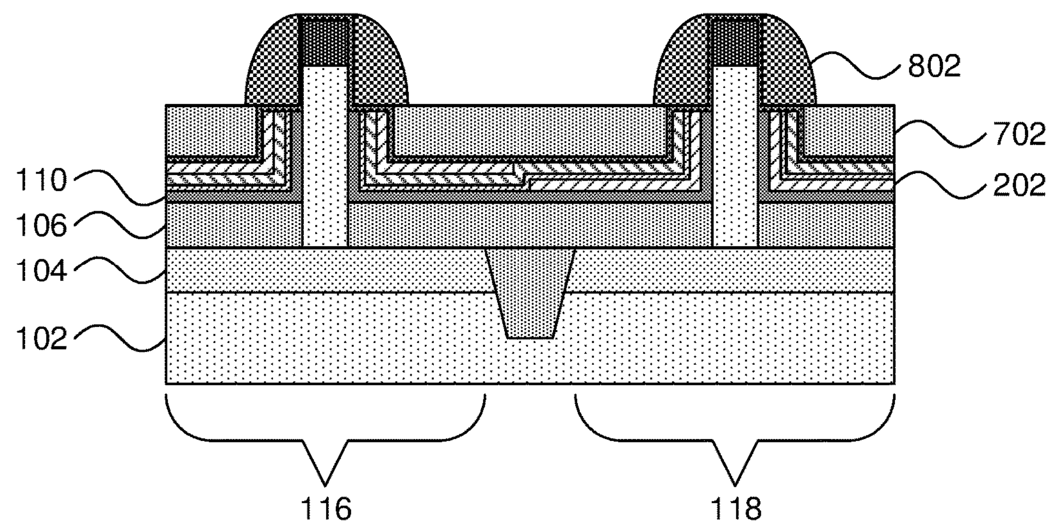
FIG. 8 is a cross-sectional diagram of a step in the formation of vertical FETs of different types having equal gate thicknesses in accordance with an embodiment of the present invention.

Referring now to FIG. 8, a cross-sectional view of a step in the formation of vertical transistors having equal gate thicknesses is shown. A spacer 802 is formed around the exposed portions of the encapsulation layer 602. The spacer 802 may be formed by, e.g., depositing a layer of hardmask material and then anisotropically etching the hardmask material to remove that material from the horizontal surfaces, leaving only the spacer 802 formed on the vertical sidewalls of the channel fins 112 outside of the encapsulation layer 602. It is specifically contemplated that the spacer 802 may be formed from silicon nitride, but any appropriate dielectric material may be used instead.

Figure 9:
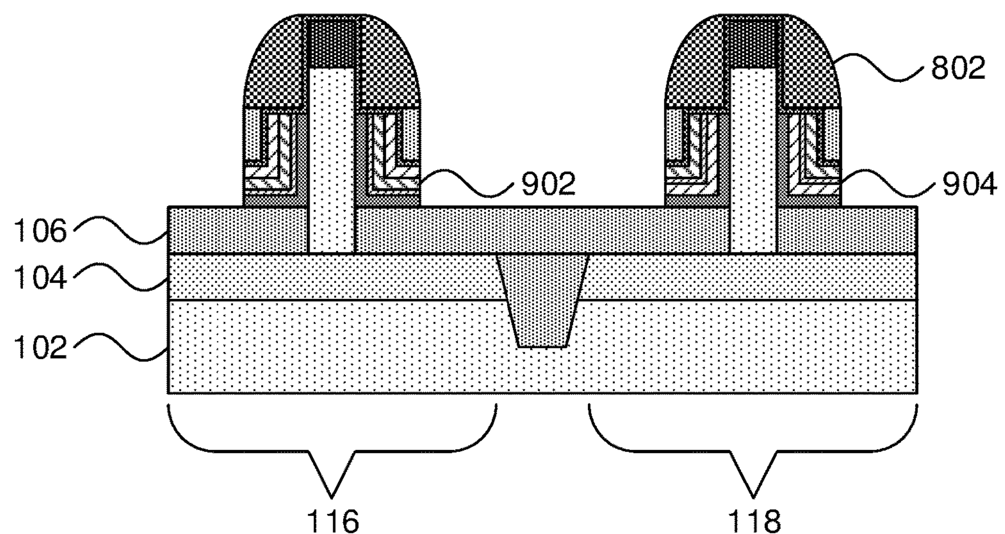
FIG. 9 is a cross-sectional diagram of a step in the formation of vertical FETs of different types having equal gate thicknesses in accordance with an embodiment of the present invention.

Referring now to FIG. 9, a cross-sectional view of a step in the formation of vertical transistors having equal gate thicknesses is shown. The spacers 802 and the fin masks 114 are used as masks while the horizontal portions of the gate stacks 502 are anisotropically etched away. The result is the formation of n-type gate stack 902 in the first region 116 and a p-type gate stack 904 in the second region 118. Notably the thickness of the n-type gate stack 902 is equal to the thickness of the p-type gate stack 904, despite their differing layers and compositions.

Figure 10:
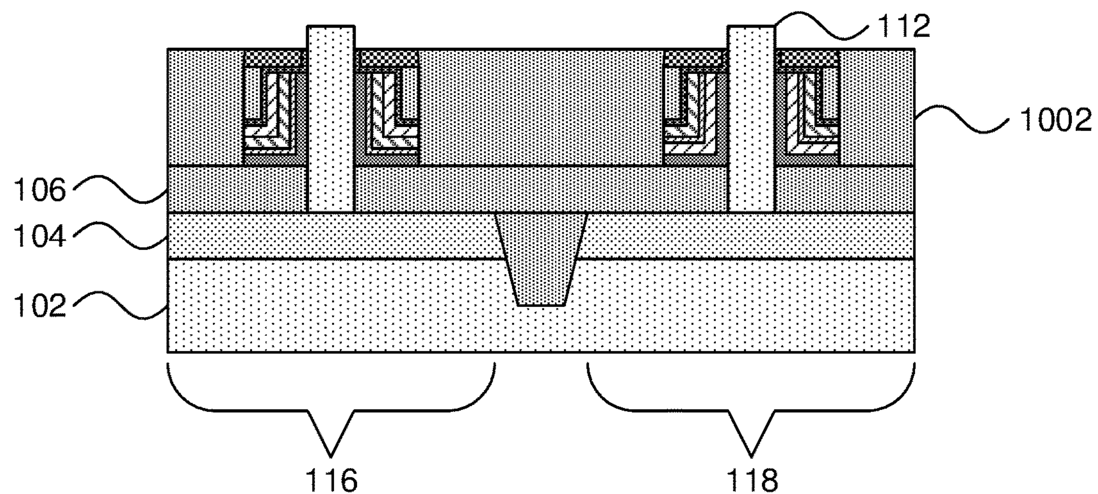
FIG. 10 is a cross-sectional diagram of a step in the formation of vertical FETs of different types having equal gate thicknesses in accordance with an embodiment of the present invention.

Referring now to FIG. 10, a cross-sectional view of a step in the formation of vertical transistors having equal gate thicknesses is shown. A layer of dielectric fill is deposited over the first region 116 and the second region 118. It is specifically contemplated that the dielectric fill may be formed from, e.g., silicon dioxide, but any appropriate dielectric material may be used instead. The fin mask 114, the dielectric fill, and the spacers 802 are etched back to expose the top portion of the channel fins 112, leaving dielectric layer 1002 between the first region 116 and the second region 118.

Figure 11:
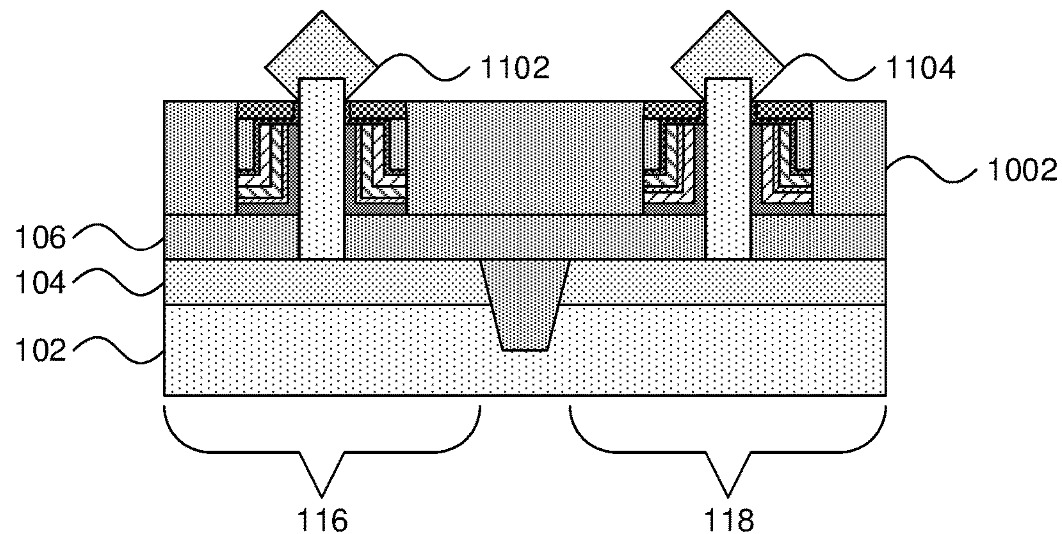
FIG. 11 is a cross-sectional diagram of a step in the formation of vertical FETs of different types having equal gate thicknesses in accordance with an embodiment of the present invention.

Referring now to FIG. 11, a cross-sectional view of a step in the formation of vertical transistors having equal gate thicknesses is shown. Top source/drain regions 1102 and 1104 are formed on the top portions of the channel fins 112. It is specifically contemplated that the top source/drain regions 1102 and 1104 may be epitaxially grown and may have a same basic composition as the channel fins 112 and bottom source/drain layer 104, but it should be understood that the top source/drain regions 1102 and 1104 may be formed from any appropriate material and may be formed by any appropriate process.

An n-type source/drain region 1102 is formed in the first region 116 and a p-type source/drain region 1104 is formed in the second region 118. It should be understood that the respective source/drain regions 1104 are doped with an appropriate n-type or p-type dopant by in situ doping or by implantation.

Figure 12:
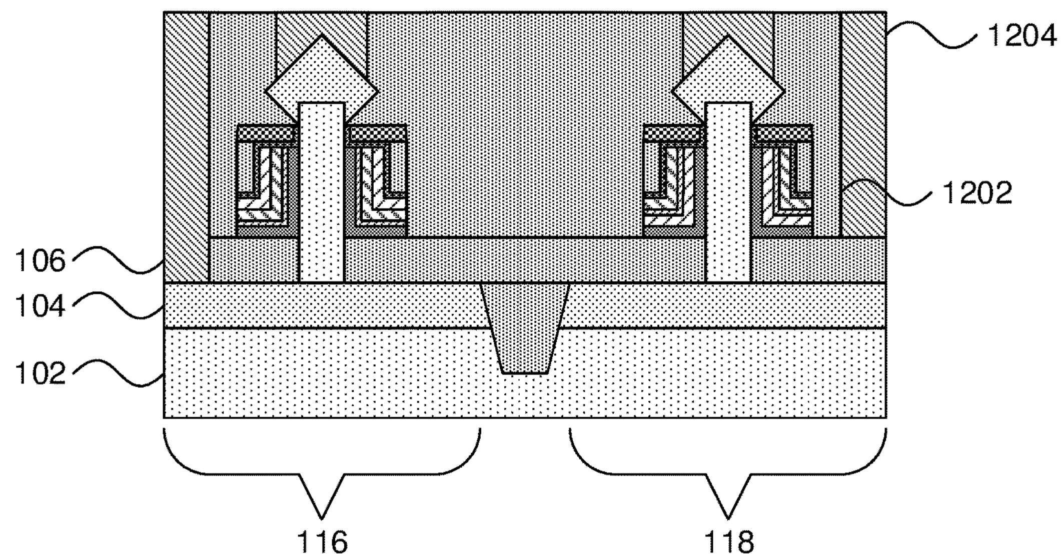
FIG. 12 is a cross-sectional diagram of a step in the formation of vertical FETs of different types having equal gate thicknesses in accordance with an embodiment of the present invention.

Referring now to FIG. 12, a cross-sectional view of a step in the formation of vertical transistors having equal gate thicknesses is shown. An inter-layer dielectric 1202 is formed from, e.g., silicon dioxide, extending the dielectric fill layer 1002 above the height of the top source/drain regions 1102 and 1104. Conductive contacts 1204 are then formed, penetrating the inter-layer dielectric 1202 to contact the top source/drain regions 1102 and 1104 and the bottom source/drain regions 104. The conductive contacts may be formed from any appropriate conductive material including, e.g., tungsten, nickel, titanium, molybdenum, tantalum, copper, platinum, silver, gold, ruthenium, iridium, rhenium, rhodium, and alloys thereof.

Figure 13:
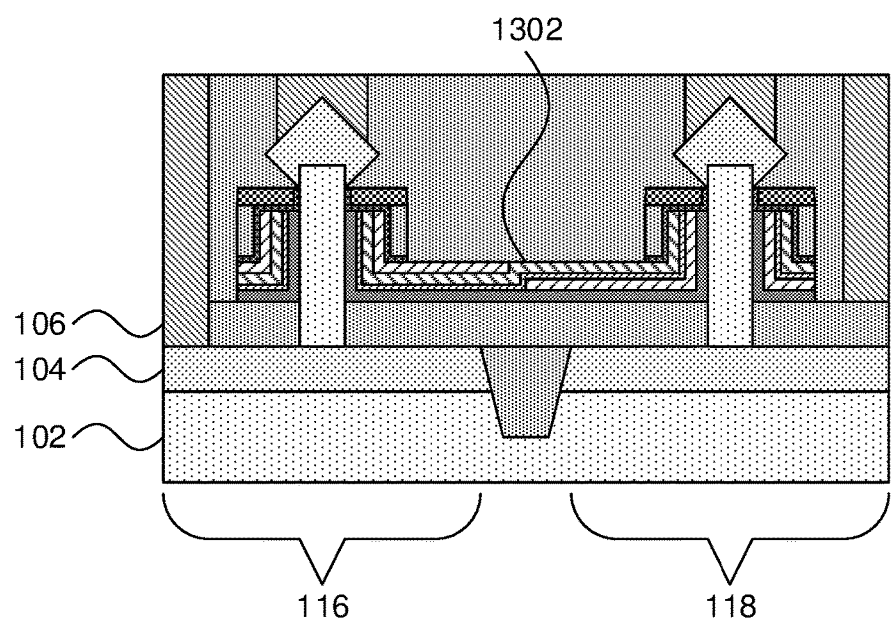
FIG. 13 is a cross-sectional diagram of a step in the formation of vertical FETs of different types having equal gate thicknesses in accordance with an embodiment of the present invention.

Referring now to FIG. 13, a cross-sectional view of an alternative embodiment of vertical transistors having equal gate thicknesses is shown. In this embodiment the gate stacks connecting the two regions 116 and 118 is not etched away, leaving a conductive connection 1302 between the two regions. In this manner the devices in the two regions can be triggered by a single shared gate. This can be accomplished by the addition of a mask in the area between the two regions before the formation of spacers 802.

Figure 14:
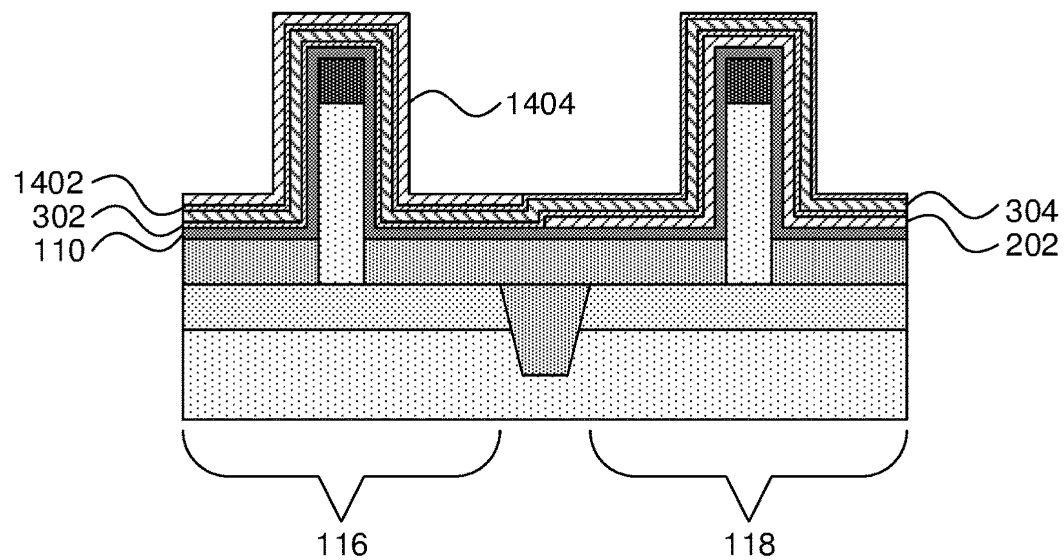
FIG. 14 is a cross-sectional diagram of a step in the formation of vertical FETs of different types having equal gate thicknesses in accordance with an alternative embodiment of the present invention.

Referring now to FIG. 14, a cross-sectional view of a step in the formation of an alternative embodiment vertical transistors having equal gate thicknesses is shown. This embodiment includes an additional step before the step of FIG. 4, where an additional layer 1402 is formed in the n-type work function metal stack. The additional layer 1402 may be formed from, e.g., titanium nitride. In this embodiment, the titanium nitride matching layer 402, which matches the thickness of the gate stack in the first region 116 to the thickness of the gate stack in the second region 118, may instead be formed with a conductor such as tungsten or cobalt to for matching layer 1404. This embodiment may then be formed into n-type and p-type transistor devices with separate or shared gate structures as described above.

Figure 15:
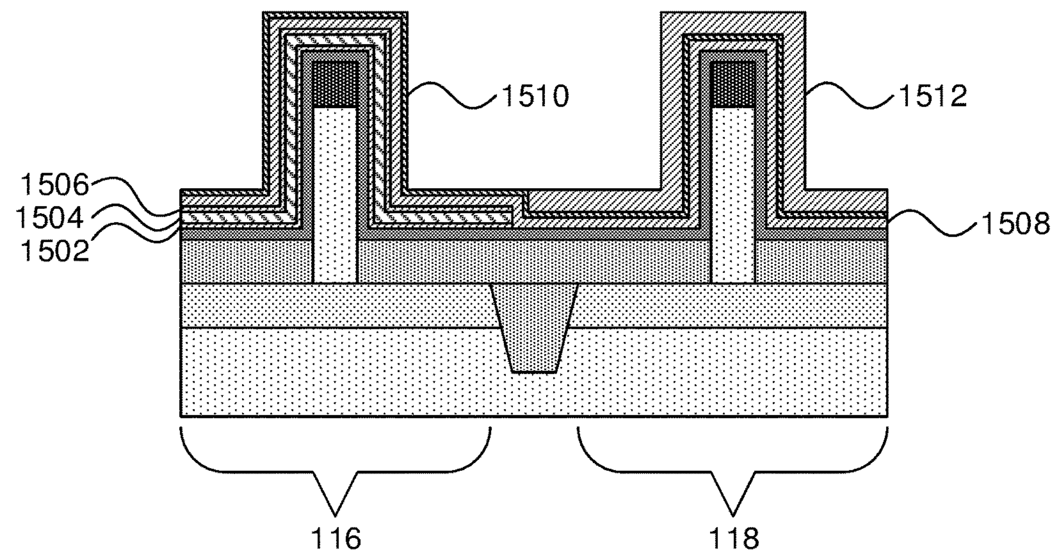
FIG. 15 is a cross-sectional diagram of a step in the formation of vertical FETs of different types having equal gate thicknesses in accordance with an alternative embodiment of the present invention.

Referring now to FIG. 15, a cross-sectional view of a step in the formation of an alternative embodiment vertical transistors having equal gate thicknesses is shown. This embodiment first forms an n-type work function metal stack and employs a scavenging layer in the second region 118. The n-type work function metal stack is formed from, e.g., a titanium nitride layer 1502, a titanium aluminum carbon layer 1504, and a titanium nitride layer 1506. After depositing the layers, the stack is patterned to confine it to the first region 116.

A p-type work function layer 1508 is then deposited over both regions 116 and 118, with the p-type work function layer 1508 being formed from, e.g., titanium nitride. A scavenging layer 1510 is formed over the p-type work function layer 1508. A matching layer 1512 is then formed in the second region 118 from, e.g., silicon nitride, such that the thickness of the stack of layers in the second region 118 equals the thickness of the stack of layers in the first region 116. The scavenging layer 1510 may be formed from, e.g., titanium aluminum carbide and either blocks oxygen diffusion from outside of the gate or scavenges the oxygen from the p-type work function layer 1508.

Figure 16:
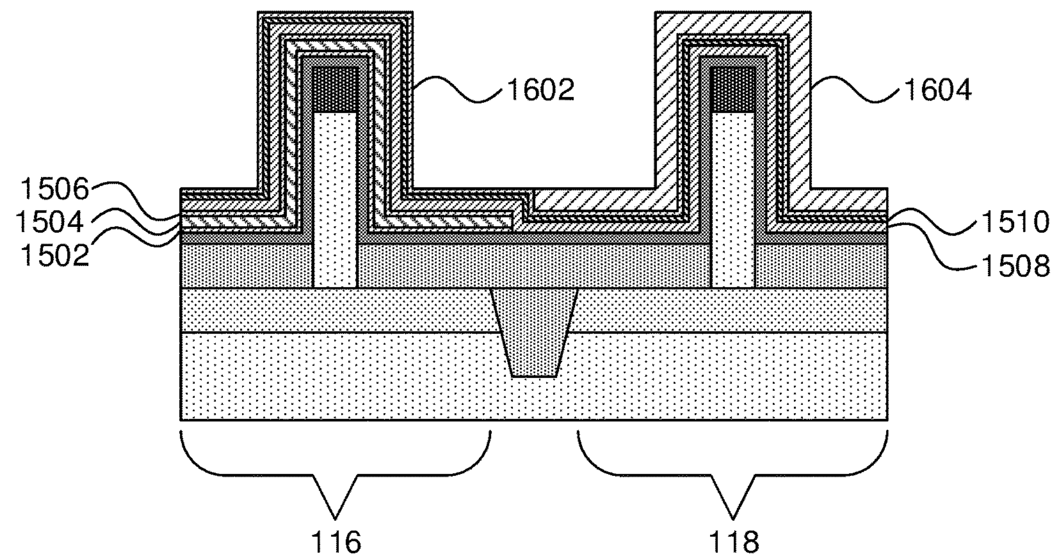
FIG. 16 is a cross-sectional diagram of a step in the formation of vertical FETs of different types having equal gate thicknesses in accordance with an alternative embodiment of the present invention.

Referring now to FIG. 16, a cross-sectional view of a step in the formation of an alternative embodiment vertical transistors having equal gate thicknesses is shown. As in FIG. 15, the n-type work function metal stack is formed in the first region 116. A layer of, e.g., titanium nitride 1508 and a scavenging layer 1510 are then deposited over both regions 116 and 118.

A thin layer 1602 of, e.g., titanium nitride is deposited over both regions followed by a matching layer 1604 in the second region 118 that is formed from, e.g., cobalt or tungsten. As in other embodiments, the matching layer 1604 matches the thickness of the gate stack in the second region 118 to the thickness of the gate stack in the first region 116.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 17:
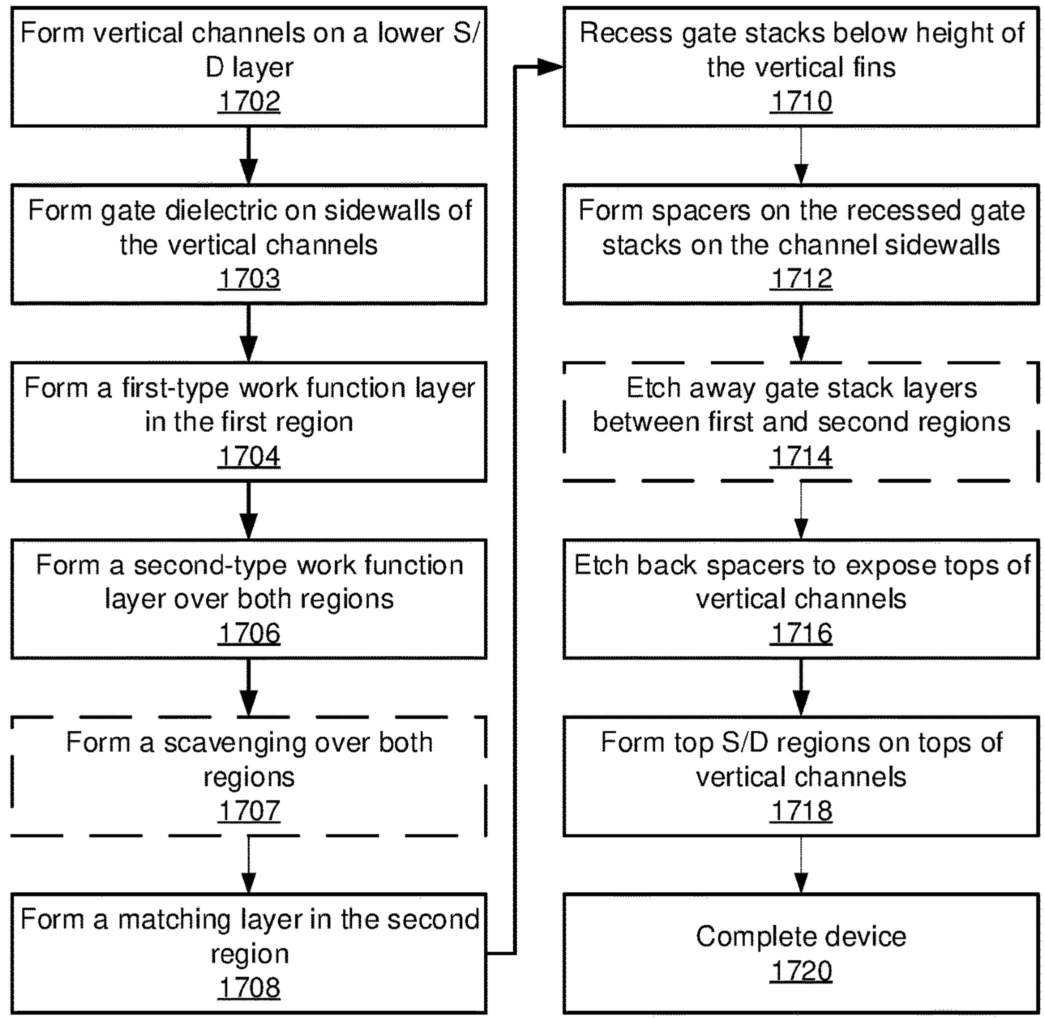
FIG. 17 is a block/flow diagram of a process for forming vertical FETs of different types having equal gate thicknesses in accordance with an embodiment of the present invention.

Referring now to FIG. 17, a method of forming transistors is shown. Block 1702 forms vertical channels 112 on a lower source/drain layer 104. The lower source/drain layer 104 may be separated into different regions, including a first region 116 and a second region 118, with respective vertical channels 112 being formed in each region. Block 1703 forms a gate dielectric 110 over the vertical channels 112 and, in particular, on the sidewalls of the vertical channels 112.

Block 1404 forms a first-type (e.g., p-type or n-type) work function layer in one of the two regions. In some embodiments the p-type work function layer may be deposited first in a p-type region, in other embodiments the n-type work function layer may be deposited in the n-type region. Block 1404 may in some embodiments conformally form the first-type work function layer on both regions and subsequently etch away the first-type work function layer from the second region.

In one embodiment, the first-type work function layer may be a p-type titanium nitride layer formed in a p-type region 118. In another embodiment, the first-type work function layer may be an n-type stack that includes an n-type titanium nitride layer and a titanium aluminum carbon layer and optionally includes a second titanium nitride layer, the n-type stack being formed in an n-type region 116.

Block 1706 forms a second-type work function layer over both regions 116 and 118. In one embodiment, the second-type work function layer may be an n-type stack that includes an n-type titanium nitride layer and a titanium aluminum carbon layer and optionally includes a second titanium nitride layer. In another embodiment, the second-type work function layer may be a p-type titanium nitride layer. The second-type work function layer will have a polarity opposite that of the first-type work function layer.

Block 1707 optionally forms a scavenging layer 1510 over the second-type work function layer. As noted above, the scavenging layer 1510 may be formed from titanium aluminum carbide and may block oxygen from the outside and/or may scavenge oxygen from the underlying second-type work function layer. The scavenging layer 1510 may have an exemplary thickness between about 2 nm and about 5 nm.

Block 1708 forms a thickness matching layer in the region that does not have the first-type work function layer. The matching layer will have a thickness that is roughly equal to the thickness of the first-type work function layer so that the thickness of the stacks in the two regions will be about equal. In one embodiment the matching layer can be formed from titanium nitride. In another embodiment, the matching layer may be formed from a metal conductor such as cobalt or tungsten.

Block 1710 recesses the gate stacks in the two regions below a height of the vertical fins 112. Block 1712 forms spacers 802 on the exposed sidewalls of the vertical fins 112. Block 1714 optionally etches away the areas of the gate stack layers between the first and second regions to sever the electrical connection between these two regions.

In alternative embodiments, block 1714 may be omitted to maintain a shared gate between the two regions.

Block 1716 etches back the spacers 802 to expose the top portions of the vertical channels 112. Block 1718 forms top source/drain regions 1102 and 1104 on the top portions of the vertical channels 112. It is specifically contemplated that the top source/drain regions 1102 and 1104 may be formed by epitaxial growth with in situ doping with dopants appropriate to the respective device type of each region. Block 1720 completes the device, forming inter-layer dielectric 1202 and electrical contacts 1204 to the top and bottom source/drain regions and the gates.

Having described preferred embodiments of vertical transport transistors with equal gate stack thicknesses (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. An integrated chip, comprising:

a first semiconductor device, the first semiconductor device comprising:
- a semiconductor channel;
- a first-type work function layer formed from a first material on the semiconductor channel; and
- a second-type work function layer formed from a second material on the first-type work function later layer; and a second semiconductor device, the second semiconductor device comprising:
- a semiconductor channel;
- a second-type work function layer formed from the second material on the semiconductor channel; and
- a thickness matching layer formed on the second-type work function layer of the second semiconductor device, the thickness matching layer having a thickness roughly equal to a thickness of the first-type work function layer.

2. The integrated chip of claim 1, further comprising an inter-device connection that connects the first semiconductor device and the second semiconductor device and comprises portions of the first-type work function layer, the second-type work function layer, and the thickness matching layer.

3. The integrated chip of claim 1, wherein the first semiconductor device is an n-type transistor and wherein the second semiconductor device is a p-type transistor.

4. The integrated chip of claim 3, wherein the first-type work function layer comprises an n-type titanium nitride layer, a titanium aluminum carbon layer, and a second titanium nitride layer and wherein the second-type work function layer comprises a p-type titanium nitride layer.

5. The integrated chip of claim 3, wherein the first semiconductor device further comprises a scavenging layer on the second-type work function layer and wherein the second semiconductor device further comprises a scavenging layer between the second-type work function layer and the thickness matching layer.

6. The integrated chip of claim 5, wherein the thickness matching layer comprises a material selected from the group consisting of titanium nitride, cobalt, and tungsten.

7. The integrated chip of claim 1, wherein the first semiconductor device is a p-type transistor and wherein the second semiconductor device is an n-type transistor.

8. The integrated chip of claim 7, wherein the first-type work function layer comprises a p-type titanium nitride layer and wherein the second-type work function layer comprises an n-type titanium nitride layer and a titanium aluminum carbon layer.

9. The integrated chip of claim 7, wherein the thickness matching layer comprises a material selected from the group consisting of titanium nitride, cobalt, and tungsten.

10. The integrated chip of claim 7, wherein the second-type work function layer further comprises a second titanium nitride layer.

11. The integrated chip of claim 1, wherein the first semiconductor device further comprises a scavenging layer on the second-type work function layer and wherein the second semiconductor device further comprises a scavenging layer between the second-type work function layer and the thickness matching layer.

12. An integrated chip, comprising:

a first semiconductor device, the first semiconductor device comprising:
- a semiconductor channel;
- a first-type work function layer formed on the semiconductor channel; and
- a second-type work function layer formed on the first-type work function layer;

a second semiconductor device, the second semiconductor device comprising:
- a semiconductor channel;
- a second-type work function layer formed on the semiconductor channel; and
- a thickness matching layer formed on the second-type work function layer, the thickness matching layer having a thickness roughly equal to a thickness of the first-type work function layer; and
- an inter-device connection that connects the first semiconductor device and the second semiconductor device, comprising portions of the first-type work function layer, the second-type work function layer, and the thickness matching layer.

13. The integrated chip of claim 12, wherein the first semiconductor device further comprises a scavenging layer on the second-type work function layer and wherein the second semiconductor device further comprises a scavenging layer between the second-type work function layer and the thickness matching layer.

14. The integrated chip of claim 13, wherein the thickness matching layer comprises a material selected from the group consisting of titanium nitride, cobalt, and tungsten.

15. An integrated chip, comprising:

a first semiconductor device, comprising:

a semiconductor channel;

a first-type work function layer formed on the semiconductor channel;

a second-type work function layer formed on the first-type work function layer; and a scavenging layer on the second-type work function layer; and a second semiconductor device, comprising:

a semiconductor channel;

a second-type work function layer formed on the semiconductor channel;

a scavenging layer on the second-type work function layer; and a thickness matching layer formed on the scavenging layer, the thickness matching layer having a thickness roughly equal to a thickness of the first-type work function layer.

16. The integrated chip of claim 15, further comprising an inter-device connection that connects the n-type transistor and the p-type transistor, said inter-device connection comprising portions of the first-type work function layer, the second-type work function layer, and the thickness matching layer.

17. The integrated chip of claim 15, wherein the first semiconductor device is an n-type transistor and wherein the second semiconductor device is a p-type transistor.

* * * * *